United States Patent [19]
Moslehi et al.

[11] Patent Number: 5,464,499
[45] Date of Patent: * Nov. 7, 1995

[54] MULTI-ELECTRODE PLASMA PROCESSING APPARATUS

[75] Inventors: Mehrdad M. Moslehi, Dallas; Cecil J. Davis, Greenville; John Jones; Robert T. Matthews, both of Plano, all of Tex.

[73] Assignee: Texas Instruments Incorporated, Dallas, Tex.

[*] Notice: The portion of the term of this patent subsequent to Oct. 12, 2010, has been disclaimed.

[21] Appl. No.: 147,761

[22] Filed: Nov. 4, 1993

Related U.S. Application Data

[62] Division of Ser. No. 903,637, Jun. 24, 1992, Pat. No. 5,286,297.

[51] Int. Cl.$^6$ ............................................. H05H 1/00
[52] U.S. Cl. ............................. 216/71; 134/1; 134/1.1; 427/569; 427/571; 156/643.1
[58] Field of Search .................................. 437/225, 228; 156/345, 643; 204/298.34, 192.32; 134/1; 118/723 E; 427/571, 569

[56] References Cited

U.S. PATENT DOCUMENTS

| | | | |
|---|---|---|---|
| 4,358,686 | 11/1982 | Kinoshita | 204/298.34 X |
| 4,464,223 | 8/1984 | Gorin | 156/345 |
| 4,633,809 | 1/1987 | Hirose et al. | 118/719 |
| 4,767,641 | 8/1988 | Kieser et al. | 118/723 E |
| 4,786,392 | 11/1988 | Kruchowski et al. | 156/345 X |
| 4,889,588 | 12/1989 | Fior | 156/643 |
| 4,960,488 | 10/1990 | Law et al. | 156/643 |
| 4,963,242 | 10/1990 | Sato et al. | 156/345 X |
| 5,006,192 | 4/1991 | Deguchi | 156/345 |
| 5,006,220 | 4/1991 | Hijikata et al. | 118/723 E |
| 5,084,125 | 1/1992 | Aoi | 156/345 |
| 5,252,178 | 10/1993 | Moslehi | 156/643 |
| 5,316,645 | 5/1994 | Yamagami et al. | 204/298.34 X |
| 5,330,606 | 7/1994 | Kubota et al. | 156/345 |

Primary Examiner—Thi Dang
Attorney, Agent, or Firm—Jacqueline J. Garner; Richard L. Donaldson; William E. Hiller

[57] ABSTRACT

A multi-electrode plasma processing system (10) provides flexible plasma processing capabilities for semiconductor device fabrication. The plasma processing equipment (10) includes a gas showerhead assembly (52) a radio-frequency chuck (24), and screen electrode (66). The screen electrode (66) includes base (68) for positioning within process chamber (10) and is made of an insulating material such as a ceramic or teflon. A perforated screen (70) is integral to base (68) and generates a plasma from a plasma-producing gas via a radio-frequency power source (104). The screen (70) has numerous passageways (78) to allow interaction of plasma and the process chamber walls. The screen (70) surrounds showerhead assembly (52) and semiconductor wafer (22) and can influence the entire semiconductor wafer plasma processing environment (62) including the plasma density and uniformity. The circuitry (74) electrically connect screen (70) to a power source (100) or (104) to cause screen (70) electrode to affect process plasma density and distribution. Any of the plasma electrodes showerhead assembly (52), chuck (24), or screen electrode (66) may be connected to a low-frequency power source (108), a high-frequency power source (100 or 132), electrical ground (110), or may remain electrically floating (94).

11 Claims, 8 Drawing Sheets

*SPECIFICATION: > 4 MV/cm

MULTI-ELECTRODE PLASMA PROCESSING APPARATUS

The U.S. Government has a paid-up license in this invention and the right, in limited circumstances, to require the patent owner to license others on reasonable terms as provided for by the terms of a contract with the United States Air Force under the program name MMST. This is a continuation of application Ser. No. 07/903,637, filed Jun. 24, 1992 now U.S. Pat. No. 5,286,297.

TECHNICAL FIELD OF THE INVENTION

The present invention generally relates to semiconductor wafer fabrication processes, and more particularly relates to a multi-electrode, multi-zone plasma processing apparatus for semiconductor wafer plasma processing for a variety of plasma-enhanced device processing applications.

BACKGROUND OF THE INVENTION

Manufacturers of electronic components use a variety of fabrication techniques to produce semiconductor devices. One technique that has many applications (e.g., deposition, etching, cleaning, and annealing) is known as "plasma-assisted" or "plasma-enhanced" processing. Plasma-enhanced processing is a dry processing technique in which a substantially ionized gas, usually produced by high-frequency electrical discharge, generates active metastable neutral and ionic species that chemically react to deposit thin material layers on or to etch materials from semiconductor substrates in a fabrication reactor.

Various applications for plasma-enhanced processing in semiconductor manufacturing include high-rate reactive-ion etching (RIE) of thin films of polysilicon, metals, oxides, and polycides; dry development of exposed and silylated photoresist layers; plasma-enhanced chemical-vapor deposition (PECVD) of dielectrics, aluminum, copper, and other materials; planarized inter-level dielectric formation, including procedures such as biased sputtering; and low-temperature epitaxial semiconductor growth processes.

Plasma-enhanced processes may use remotely-generated or locally-generated plasmas. Remotely-generated plasma is a plasma that a plasma-generating device produces external to a fabrication reactor. The plasma is guided into the main process chamber and there interacts with the semiconductor wafer for various desired fabrication processes. Locally-generated plasma is a plasma that a plasma-generating charged electrode forms within the process chamber and around the semiconductor wafer from suitable process gases. Conventional plasma processing reactors for etch and deposition applications usually employ 13.56 MHz plasmas, 2.5 GHz remote plasmas, or a combination of these plasmas. In conventional systems, a plasma-generating radio-frequency power source connects electrically to a conductive wafer holding device known as a wafer susceptor or chuck. The radio-frequency power causes the chuck and wafer to produce a radio-frequency plasma discharge proximate the wafer surface. The plasma medium interacts with the semiconductor wafer surface and drives a desired fabrication process such as etch or deposition.

Opposite and parallel to the wafer and chuck in these systems is a showerhead assembly for injecting the plasma-generating gas or gas mixtures into the process chamber. This is known as a parallel-plate configuration due the parallel surfaces of the chuck and showerhead. Typically, the showerhead connects to an electrical ground. In some designs, however, the showerhead assembly may connect to the plasma-generating radio-frequency power source, while the chuck and semiconductor wafer connect to an electrical ground. Still other configurations may use a combination of locally-generated plasma and remotely-generated plasma. In all of these known configurations, various limitations exist which contains the plasma process application domain.

Limitations associated with using only two parallel plates include inefficient in-situ chamber cleaning and less than desirable process control flexibility. In particular, the conventional parallel-plate configuration does not provide adequate control or adjustment over deposited plasma process uniformity. Moreover, there is no independent control over deposited film stress, deposition rate, and deposition uniformity. For example, a change in a process parameter to reduce film stress may adversely affect deposition rate, and vice versa. Further, no independent control over etch rate, selectivity, or anisotropy in plasma-enhanced etch and RIE processes occurs in these types of systems.

Consequently, there is a need for a semiconductor wafer fabrication process that overcomes the limitations of known systems to permit efficient in-situ chamber cleaning while providing necessary control over plasma-enhanced fabrication processes.

There is a need for a method and apparatus for plasma-enhanced semiconductor device fabrication that offers improved control over known methods and apparatuses. In particular, there is a need for a plasma-enhanced device fabrication method and system that improves the control and adjustment of semiconductor wafer plasma processing uniformity.

There is a need for a semiconductor wafer fabrication method and apparatus that offers flexible control over film stress, deposition rate, and deposition uniformity in plasma-enhanced deposition applications.

Furthermore, there is a need for a method and system that permits flexible control over semiconductor wafer etch rate, selectivity, and anisotropy in plasma-enhanced RIE processes.

SUMMARY OF THE INVENTION

The present invention, accordingly, provides a plasma processing system configuration for enhanced semiconductor wafer processing that overcomes or reduces disadvantages or limitations associated with prior plasma processing methods and apparatus.

One aspect of the invention is a plasma processing system configuration for enhanced semiconductor wafer processing in a fabrication reactor process chamber that includes a base that may be positioned within the process chamber and which is made of an electrically insulating material such as a ceramic or teflon. A screen mounts integrally to the base and generally is made of an electrically conducting material that may conduct a radio-frequency power for generating plasma from a plasma-producing gas or gas mixture. A plurality of passageways or holes on the screen permit interaction of the plasma environment with chamber walls within the process chamber. The screen surrounds the semiconductor wafer, a showerhead that flows plasma-producing gases into the process chamber, and a radio-frequency chuck that holds the semiconductor wafer. By surrounding the wafer, the showerhead, and the radio-frequency chuck, the screen electrode of the present invention creates an environment for multi-electrode plasma processing proximate the semiconductor wafer. The invention further includes circuitry for electrically connecting the screen electrode and other electrodes to various radio-frequency sources to produce a desired plasma processing environment.

A technical advantage of the present invention is that it significantly facilitates both in-situ chamber cleaning and semiconductor wafer processing within the fabrication reactor process chamber. For example, the present invention permits flexible in-situ chamber cleaning intermittent with semiconductor wafer processing. Processes that the present invention permits include mixed remote-plasma and radio-frequency plasma processing, mixed radio-frequency magnetron and radio-frequency plasma processing, and mixed/multi-frequency multi-electrode plasma processing.

Another significant technical advantage of the present invention is that it enhances the capabilities for real time control of plasma processing parameters. These parameters include plasma process uniformity control, film stress control such as that occurring in plasma-enhanced chemical-vapor deposition, and sidewall angle or anisotropy control during plasma etch processing.

BRIEF DESCRIPTION OF THE DRAWINGS

The invention and its modes of use and advantages are best understood by reference to the following description of illustrative embodiments when read in conjunction with the accompanying drawings, wherein.

DETAILED DESCRIPTION OF THE INVENTION

Figure 1:
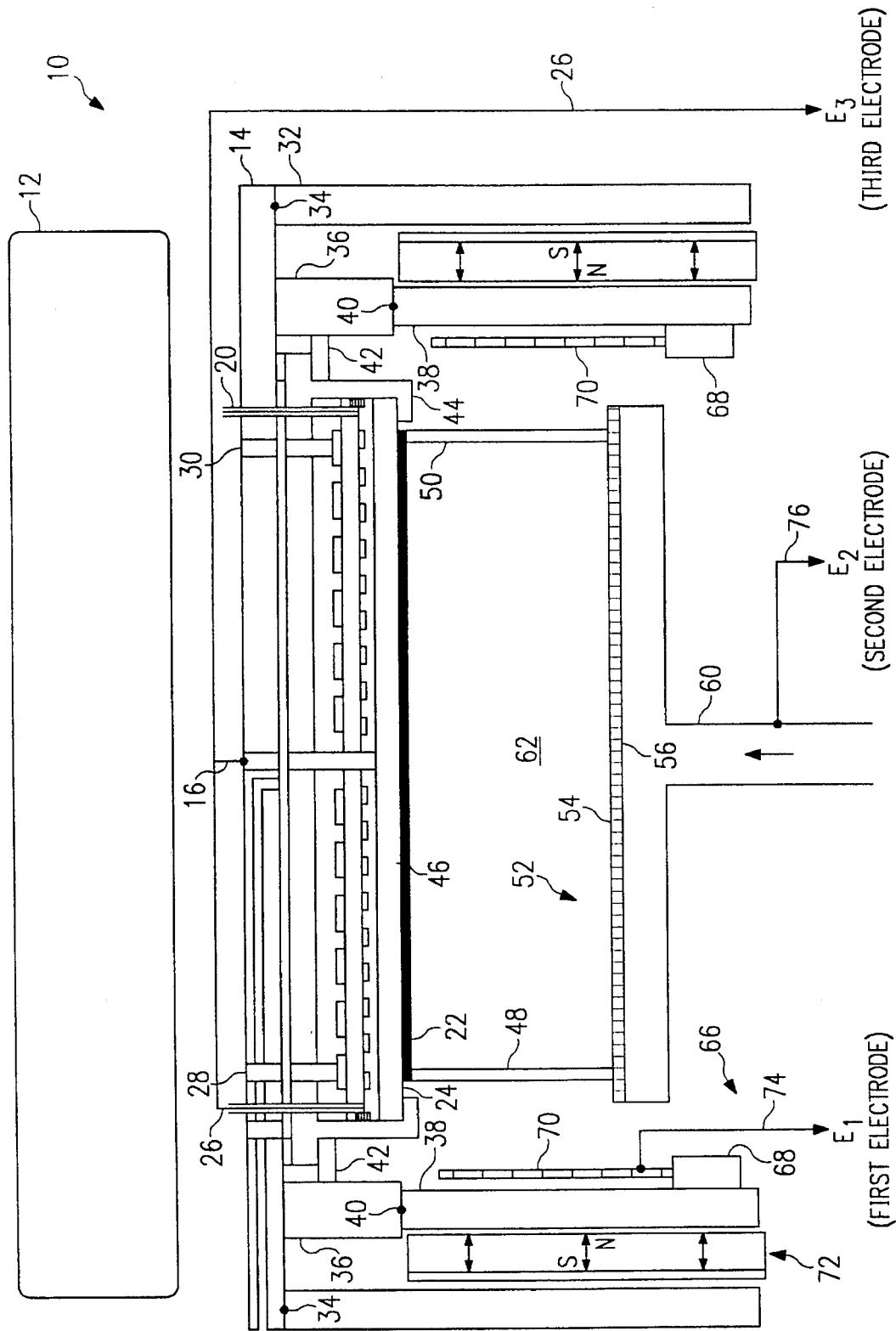
FIG. 1 provides a simplified schematic diagram of a representative semiconductor wafer processing reactor plasma process chamber to illustrate the concepts of the preferred embodiment.

The preferred embodiment of the present invention is best understood by referring to the Figures wherein like numerals are used for like and corresponding parts of the various drawings.

The invention permits single-wafer plasma-assisted device fabrication, however, multi-wafer fabrication may also be accomplished using the multi-electrode configuration of the preferred embodiment. Processes such as chemical-vapor deposition (CVD) and etch tend to leave by-products or deposits on various parts and inner surfaces of the process chamber. One problem that chamber deposits from an earlier process may cause is adverse effects on process uniformity, repeatability, and particle contamination. In conventional plasma processing, it is not possible to provide in-situ chamber cleaning with a high degree of cleaning process parameter control flexibility. Moreover, the conventional plasma processing methods do not provide flexible real time capabilities for plasma uniformity control and plasma parameter adjustments provide hardware and process capabilities in order to improve plasma processor capability and performance. To achieve these results, effective in-situ chamber cleaning during or after a deposition or etch process is particularly attractive. The preferred embodiment accommodates these types of effective in-situ cleaning processes as well as improved plasma processing capabilities.

In conventional single-wafer plasma processing chambers, a 13.56 MHz source generates plasma discharge between two parallel plates. One plate typically is a radio-frequency chuck that holds the semiconductor wafer. The other is a metallic showerhead assembly that delivers the plasma-producing gases into the process chamber. Some designs power the chuck that hold the semiconductor wafer and connect the showerhead assembly to an electrical ground. Other designs power the showerhead assembly and ground the chuck. Limitations with this design include an inability to perform effective in-situ chamber cleaning, as well as general inefficiency and lack of plasma process uniformity control.

The principal problem that causes lack of plasma process uniformity control is the interdependence between various parameters during the plasma processing and lack of flexible process control parameters. For example, in conventional systems, essentially the only way to adjust plasma process uniformity is to vary process parameters that may impact the plasma such as RF power, gas flow, or pressure. Changing these parameters, however, may adversely affect other process parameters such as deposition or etch rate and plasma-induced damage. The present invention permits flexible adjustment of plasma process uniformity without adversely affecting other important plasma process parameters. As a result, the effective in-situ chamber cleaning and flexible control of the present invention provide increased process repeatability and uniformity as well as enhanced process cleanliness.

The following discussion describes how the preferred embodiment achieves these and other objects of the present invention.

FIG. 1 shows a partially broken-away diagrammatic view of fabrication reactor plasma processing chamber 10 that may also include a magnetron module 12 above reactor chamber lid 14. Reactor chamber lid 14 has several connector penetrations such as for thermocouple connections 16 and 20 to permit wafer temperature sensing. For example, thermocouple connection 16 permits sensing semiconductor wafer 22 temperature. Other penetrations through reactor lid 14 to chuck 24 include chuck electrode line 26 (described below as electrode line $E_3$) and coolant inlet 28 and outlet 30. U.S. patent application Ser. No. 07/565,765 filed on Aug. 10, 1990, by Mehrdad M. Moslehi and assigned to Texas Instruments Incorporated more particularly describes chuck 24 and is incorporated by reference herein.

Process chamber lid 14 joins reactor outer wall 32 at seal regions 34. Also, lid 14 contains support 36 that rests upon plasma chamber collar 38 at contact seal 40. Support 36 also includes ledge 42 that supports enclosure module 44 to hold chuck 24. Chuck 24 contacts semiconductor wafer 22 on bottom surface 46. Low thermal mass pins 48 and 50 support semiconductor wafer 22, causing it to maintain contact with chuck 24. Low thermal mass pins 48 and 50 are supported via showerhead assembly 52 that includes showerhead injector 54.

Showerhead injector 54 permits the flow of plasma-producing gases through gas channel 60 into showerhead injector 54 and through perforated plate 56. Additionally, remotely-generated plasma may come from a plasma generating module (not shown) into the processing environment 62 for additional process activation.

Surrounding showerhead assembly 52 is perforated cylindrical electrode or screen 66 of the preferred embodiment. Perforated cylindrical electrode or screen 66 includes insulating base portion 68 and conductive screen portion 70. Additionally, multi-pole permanent magnet module 72 may be used to surround chamber collar 38 to induce magnetron enhancement within processing environment 62.

The hardware configuration of the plasma processing environment that uses the preferred embodiment including cylindrical screen electrode 66 includes three electrode lines that may be connected to radio-frequency energy source or electrical ground. These include electrode line $E_1$, designated as 74, to perforated cylindrical electrode or screen 66, electrode line $E_2$ to showerhead assembly 52, designated as 76, and electrode line $E_3$, previously designated as 26, connecting to chuck 24.

Figure 2:
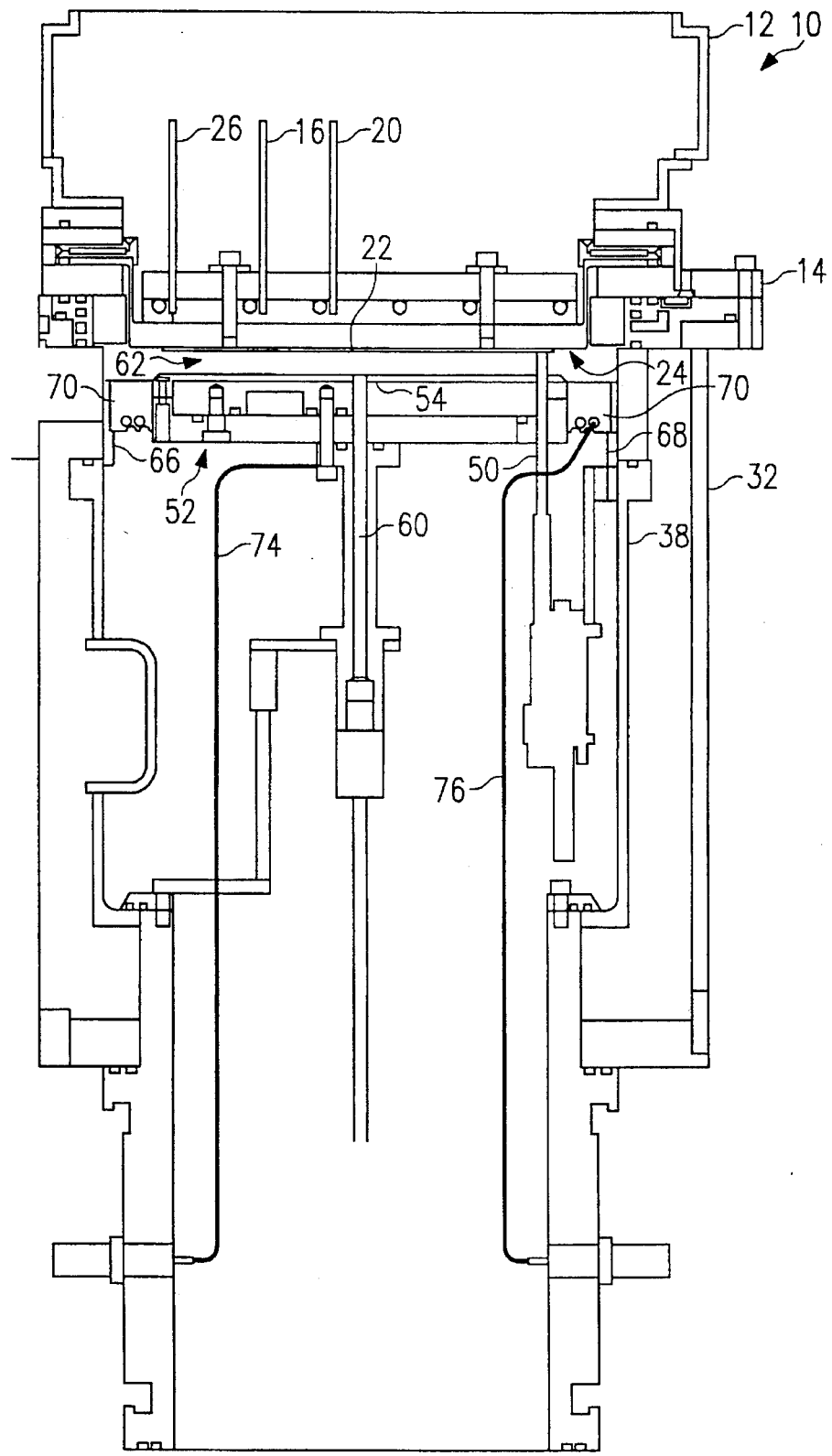
FIG. 2 shows a detailed schematic of a fabrication reactor process chamber that includes the preferred embodiment of the present invention within a single-wafer advanced vacuum processor.

FIG. 2 shows a detailed diagrammatic cut-away side view of the preferred embodiment to show an actual design within a single-wafer fabrication reactor plasma process chamber such as the Texas Instrument Automated Vacuum Processor (AVP). Components with associated reference numerals in FIG. 2 operate and interconnect as described with reference to FIG. 1.

Figure 3:
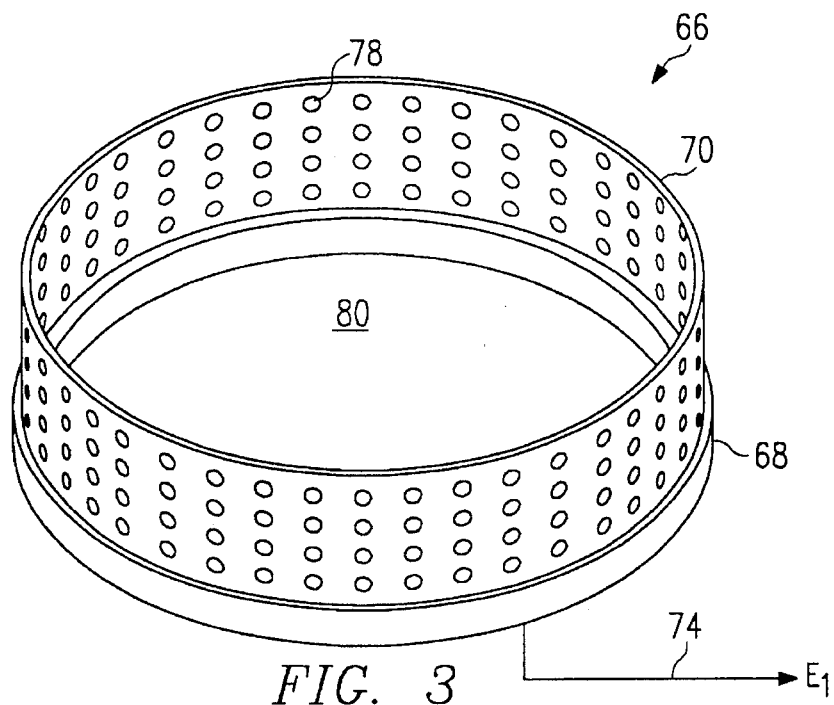
FIG. 3 provides an isometric view of the plasma processing screen electrode of the preferred multi-electrode embodiment.

FIG. 3 more particularly illustrates perforated cylindrical or screen electrode 66 of the preferred embodiment. Cylindrical electrode or screen 66 includes base 68 made of an electrically insulating material such as teflon or a ceramic material and upper portion or screen 70 made of an electrically conducting material such as surface-anodized aluminum. Within screen 70 are multiple holes or passageways such as passageway 78 to permit plasma to communicate with the process chamber walls for effective in-situ cleaning.

For the preferred embodiment, cylindrical electrode 66 must be sufficiently large to surround showerhead 52 and sufficiently small to fit within the diameter of plasma process chamber collar 38. Insulating (teflon) base 68 must be sufficiently strong to support screen electrode 70 and should be of an insulating material to electrically isolate screen electrode 70 from the remainder of electrode conductive components within plasma process chamber 10. Screen electrode 70 is a perforated cylinder sufficiently tall to cover the entire height of plasma process environment 62 between showerhead assembly 52 and plasma chuck 24. Passing to and through insulating base 68 is electrode lead $E_1$ 74 which connects the screen electrode 70 to a radio-frequency power source or an electrical ground. Depending on its connection modes screen electrode 70 contributes to various modes of plasma generations for wafer processing and in-situ chamber cleaning.

Figure 4:
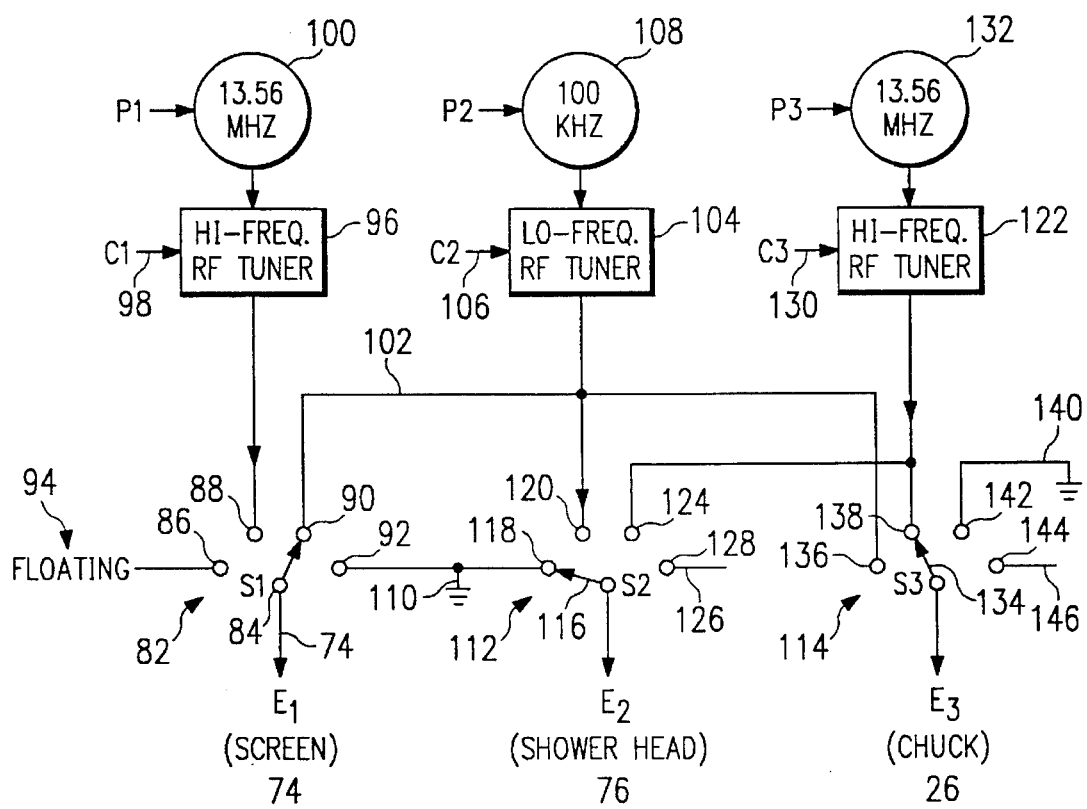
FIG. 4 illustrates possible multi-electrode/multi-frequency radio-frequency connections usable with the preferred embodiment.

FIG. 4 shows the multi-electrode/multi-frequency electrical connections for electrode lines $E_1$ 74 to screen electrode 70, $E_2$ 76 to showerhead 52, and $E_3$ 26 to chuck 24. Although other frequency sources may be used with the preferred embodiment, the electrical circuit diagram of FIG. 4 is useful to illustrate essential concepts. Beginning with $E_1$ 74, switch 82 includes rotatable connector 84 that may engage floating line contact 86, high-frequency (e.g., a 13.56 MH$_z$ RF source contact 88, low-frequency (e.g., 100 kH$_z$ source) contact 90, and electrical ground contact 92. Floating line contact 86 connects electrode line $E_1$ 74 to floating lead 94, so that screen 70 has no external electrical connection and only minimally affects plasma within process chamber 10. Contact 88 connects electrode line $E_1$ 74 to high-frequency RF tuner 96. High-frequency RF tuner 96 receives control input 98 and transmits a 13.56 MHz power signal from power source 100. This connection will cause cylindrical screen electrode 70 to generate a 13.56 MHz plasma. Contact 90 connects $E_1$ 74 through line 102 to low-frequency RF tuner 104. Low-frequency RF tuner 104 receives control input 106 and 100 kHz power input 108. By connecting electrode line $E_1$ 74 to low-frequency RF tuner 104, cylindrical screen electrode 70 produces a 100 kHz plasma within process chamber 10. Contact 92 connects electrode line $E_1$ 74 to electrical ground 110 to cause grounding of plasma energy in the proximity of cylindrical electrode 66.

Switch 112 for electrode line $E_2$ 76 leading to showerhead assembly 52 and switch 114 for electrode line $E_3$ 26 connecting to chuck 24 have connections similar to those of switch 82. In particular, rotatable contact 116 of switch 112 connects electrode line $E_2$ 76 to electrical ground 110 via contact 118, to low-frequency tuner 104 via contact 120, to high-frequency tuner 122 through contact 124, and to a floating lead 126 via contact 128. High-frequency tuner 122 operates essentially the same as high-frequency tuner 96, and includes control input 130 and 13.56 MHz power input 132. Furthermore, switch 114 includes selectable contact 134 for connecting to contact 136 for low-frequency RF energy from low-frequency RF tuner 104, contact 138 for input from high-frequency RF tuner 122, connection to ground 140 via contact 142, and connection to floating line 144 via contact 146.

The multi-electrode, dual-frequency/radio-frequency connections of FIG. 4 permit substantial flexibility and a capability for multi-zone plasma processing. With the two high-frequency RF sources 106 and 132, together with 100 kHz low-frequency RF source 108, numerous combinations of plasma processing and in-situ cleaning may occur. Any one of the three electrodes $E_1$, $E_2$ or $E_3$ may be selectively connected to a floating lead, a high-frequency RF source, a low-frequency RF source, or to ground. The following discussions describe various connections for processes that the multi-electrode configuration of the preferred embodiment may perform.

Fabrication Process Method 1

Connect electrode line $E_1$ 74 through select switch 84 to contact 86 for connection to floating line 94. Connect electrode line $E_2$ 76 through switch 116 to ground 110 at contact 118, and electrode line $E_3$ 26 through switch 134 to high-frequency RF tuner 122 via contact 138. This is a conventional mode of plasma-enhanced chemical-vapor deposition (PECVD) in which floating electrode line $E_1$ causes cylindrical screen electrode $E_1$ to have minimal effect within process chamber 10.

Fabrication Process Method 2.

Connect electrode line $E_1$ to high-frequency RF tuner 96 by rotating switch 84 to contact 88, electrode line $E_2$ to ground by rotating switch 116 to contact 118, and electrode line $E_3$ to high-frequency RF tuner 122 by rotating switch 134 to contact 138. This connection permits dual-zone plasma processing within process chamber 10. The radio-frequency powers of cylindrical screen electrode 66 from electrode line $E_1$ and chuck 24 from electrode line $E_3$ may adjusted for optimal plasma process uniformity and/or minimal film stress. Note that this process may be performed with more than two plasma zones such as in the alternative embodiment of gas showerhead 184 in FIG. 9.

Fabrication Process Method 3

Connect electrode line $E_1$ to low-frequency RF tuner 104, line $E_2$ to ground, and electrode line $E_3$ to high-frequency RF tuner 122. This causes cylindrical screen electrode 66 to absorb a 100 kHz power that produces a low-frequency plasma, and radio-frequency chuck 24 to absorb a 13.56 MHz power signal that enhances PECVD processing by controlling uniformity and/or stress. Thus, using this method, cylindrical screen electrode 66 may generate a dense 100 kHz plasma that diffuses within the entire process chamber 10. The RF frequency of chuck 24 controls the ion energy impinging on the wafer. This makes it possible to control the layer stress through adjusting the ion energy. The power that cylindrical screen electrode 66 receives may independently control the deposition or etch rate, while the power that chuck 24 receives permits chuck 24 to control the layer stress and/or process uniformity.

Fabrication Process Method 4

Connect electrode line $E_1$ 74 to ground, electrode line $E_2$ 76 to high-frequency RF tuner 122, and electrode line $E_3$ 26 to ground. This yields a plasma process environment that permits deposition or etch with reduced ion energies on the wafer. Essentially, electrode $E_2$ provides a 13.56 MHz power signal to showerhead assembly 52, while cylindrical screen electrode 66 and chuck 24 are grounded. As a result, the ion energy is reduced, thereby causing a softer impact of the ions on the wafer 22 surface.

Fabrication Process Method 5.

Connect electrode line $E_1$ 74 to high-frequency RF tuner 96, electrode line $E_2$ 76 to ground, and electrode line $E_3$ 26 to low-frequency RF tuner 104. In this PECVD process, cylindrical screen electrode 66 generates process plasma, while chuck 24 controls ion energy and induced layer stress. This method is similar to process method 3, above, except that with process method 3, cylindrical screen electrode 66 absorbs a 100 kHz signal plasma, while RF chuck 24 absorbs a 13.56 MHz signal to enhance the PECVD processing and to control stress. This process method 5 essentially reverses the connections that appear in process method 3. As a result, RF chuck 24 produces a lower frequency output that may increase ion bombardment on wafer 22 surface. There are certain plasma processes in which enhanced ion bombardment may be more desirable. In such instances, process method 5 is preferable to process method 3.

Fabrication Process Method 6

Connect electrode line $E_1$ to high-frequency RF tuner 96, electrode line $E_2$ 76 to ground, and leave electrode line $E_3$ 26 floating. This causes cylindrical electrode 66 to generate RF magnetron plasma. In this process, a remote microwave plasma may be direct plasma to semiconductor wafer 22 with negligible ion energies.

Fabrication Process Method 7

Connect electrode line $E_1$ 74 to ground, electrode line $E_2$ 76 to low-frequency RF tuner 104, and electrode line $E_3$ 26 to high-frequency RF tuner 122. This method permits PECVD processing with continuous ion bombardment effects on showerhead assembly 52 and cylindrical electrode 66. This process assists in preventing process chamber deposits, because it produces minimal ion bombardment on showerhead assembly 52 and electrode 66.

Fabrication Process Method 8

Connect electrode line $E_1$ 74 to ground, electrode line $E_2$ 76 to floating line 126, and electrode line $E_3$ to high-frequency RF tuner 122. This method permits a PECVD process that has modified plasma process uniformity and ion energies.

Fabrication Process Methods 1 through 8, above, illustrate that the preferred embodiment provides significant flexibility to yield optimal plasma process uniformity, rate control, and layer stress control during plasma-enhanced semiconductor device fabrication. Additionally, because the connections from electrode lines $E_1$ 74, $E_2$ 76, and $E_3$ 26 through switches 82, 112, and 114, respectively, to the various ground, floats, and power sources may be made in real time, additional process parameter control flexibility results.

Not only does the preferred embodiment permit flexibility in etching and other wafer fabrication processes, but also the preferred embodiment provides significantly enhanced in-situ chamber cleaning flexibilities. In particular, the preferred embodiment permits effective in-situ chamber cleaning in real time associated with wafer etch and deposition processes. For example, the in-situ cleaning that preferred embodiment provides may be performed after each PECVD process, such as for deposition of silicon dioxide, silicon nitride, amorphous silicon, etc. to remove any residual deposits from process chamber 10 inner surfaces. Showerhead assembly 52 and chamber collar 38 may hold residual deposits or contaminants for which removal is necessary. For removing these residual deposits, chamber cleaning chemistry may include a plasma such as a combination of argon and $CF_4$, or argon and $NF_3$, or argon and $SF_6$. Various methods for in-situ cleaning with the preferred embodiment may use the following electrode connections.

Cleaning Process Method 1

Connect electrode line $E_1$ 74 to ground, electrode line $E_2$ 76 to low-frequency RF tuner 104, and electrode line $E_3$ 26 to ground 20. This configuration causes plasma generation and impact of high energy etch ions on the surface of showerhead assembly 52 to permit showerhead assembly 52 cleaning.

Cleaning Process Method 2

Connect electrode line $E_1$ 74 to low-frequency RF tuner 104, electrode line $E_2$ 76 and electrode line $E_3$ 26 to ground. These connections yield a plasma environment for cleaning process chamber collar 38 within process chamber 10 via the screen electrode 66.

Cleaning Process Method 3

Connect electrode lines $E_1$ 74 and $E_2$ 76 to ground, and electrode line $E_3$ 24 to low-frequency RF tuner 104. These connections clean any residual deposits from the RF chuck 24.

Cleaning Process Method 4

Connect electrode line $E_1$ 74 to ground, electrode line $E_2$ 76 to low-frequency RF tuner 104, and electrode line $E_3$ to high-frequency RF tuner 122. This configuration intensifies the plasma energies for cleaning showerhead assembly 52.

Figure 5:
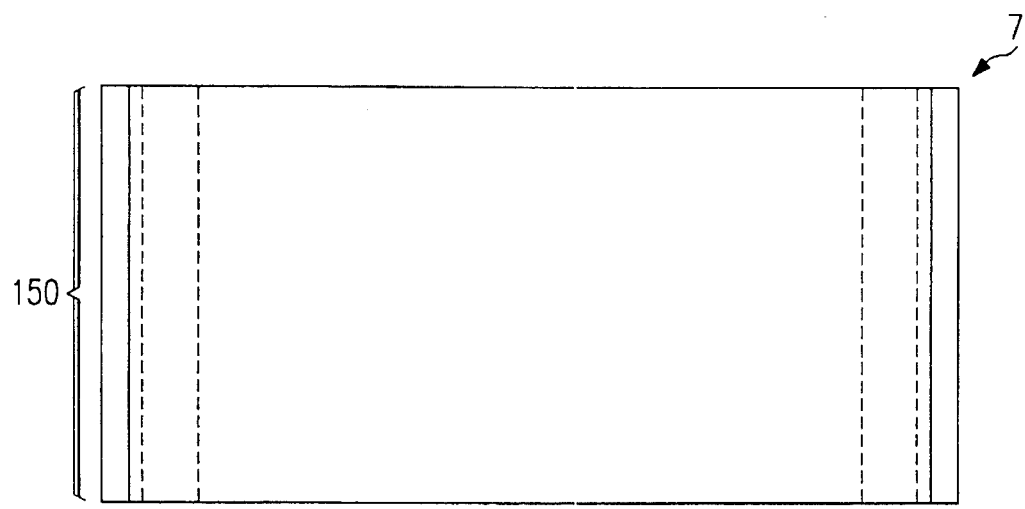
FIGS. 5 and 6, respectively, show side and top views of a first permanent magnet module usable to enhance operation of the preferred embodiment via magnetron plasma enhancement.
Figure 6:
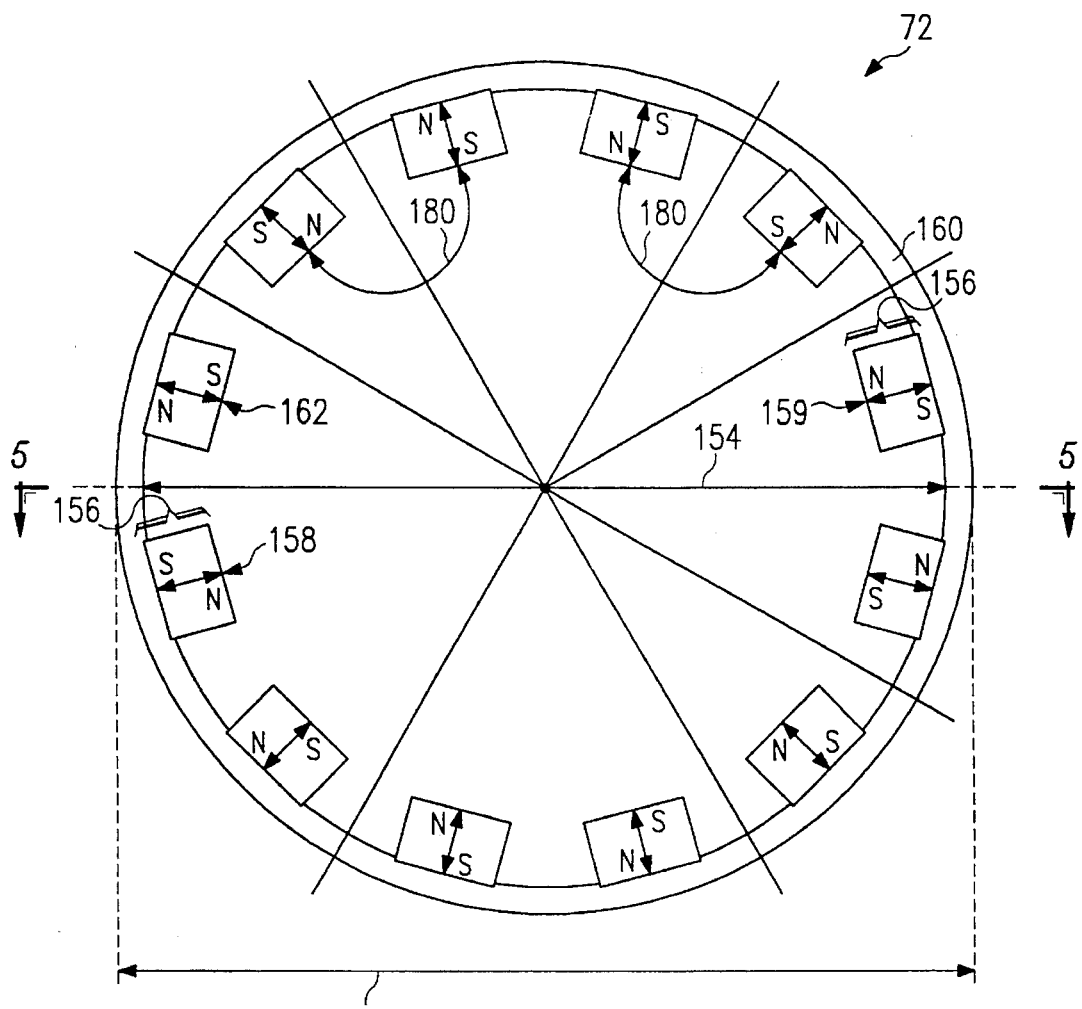

FIGS. 5 and 6, respectively, show a side and top view of magnetron permanent magnet assembly 72 that the preferred embodiment may use. Magnetron permanent magnet assembly 72 permanent magnet assembly has a height 150 sufficiently tall to span the height of process environment 62 within process chamber 10. Moreover, magnetron permanent magnet assembly 72 has an outer diameter 152 sufficiently small so that assembly 72 fits within reactor casing wall 32 and an inner diameter 154 sufficiently large so that, when combined with the width 156 of two magnets such as magnets 158 and 159 that permanent magnet assembly 72 fits easily around process chamber collar 38. Magnets such as magnets 158 are positioned, in the embodiment of magnetron permanent magnet assembly 72, to be 30° apart radially with alternating north and south poles contacting magnetron outer wall 160. That is, if magnet 158, for example, has its north pole contacting wall 160 and its south pole facing the inner portion of magnetron 72, magnet 162 adjacent to magnet 158, has its south pole contacting outer wall 160 and its north pole directed to the magnetron 72 center. In the embodiment of FIGS. 5 and 6, separating magnets 158 and 162 by 30° with alternating north and south poles contacting outer wall 160 permits the placement of 12 such magnets along the inner diameter of outer wall 160.

Figure 8:
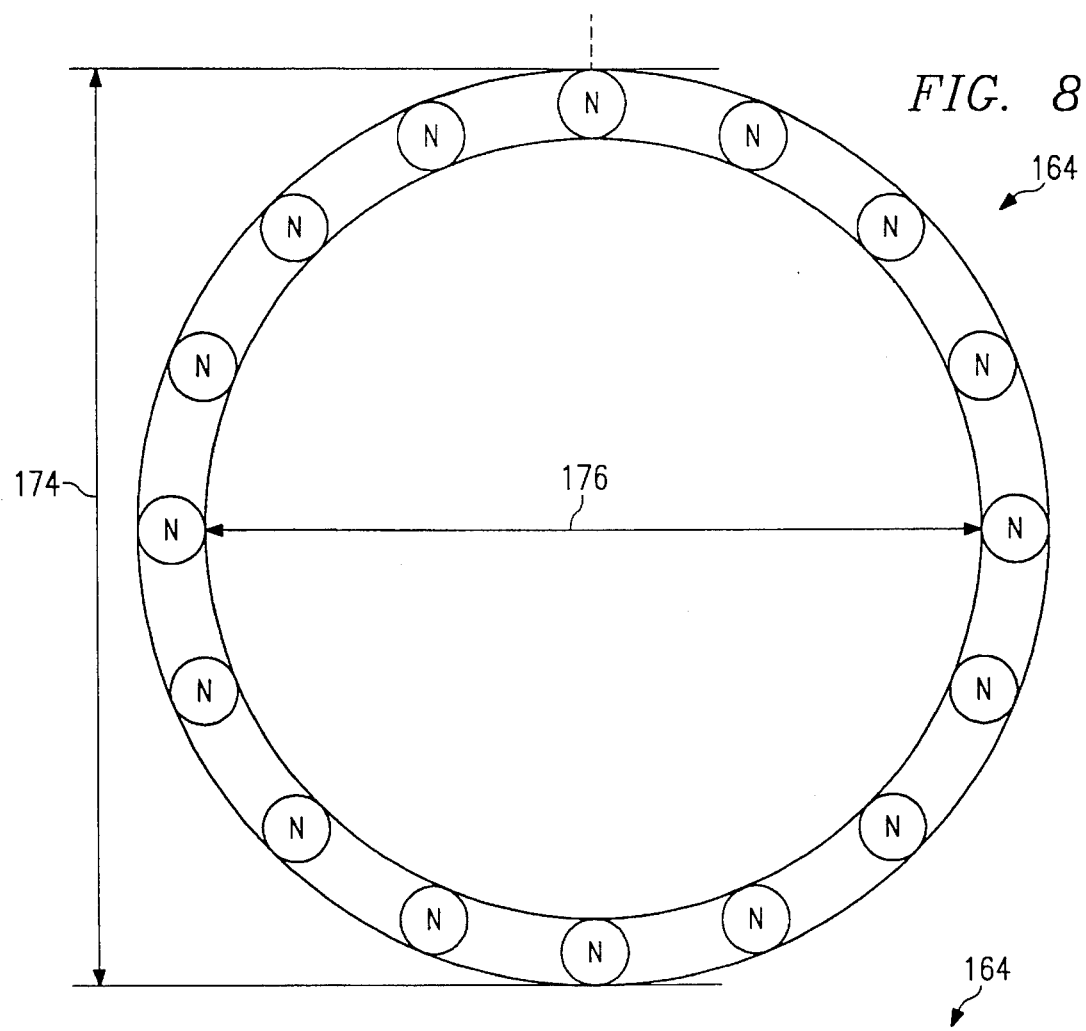
FIGS. 7 and 8, respectively, show side and top views of a second permanent magnet module usable with the preferred embodiment for magnetron plasma enhancement.
Figure 7:
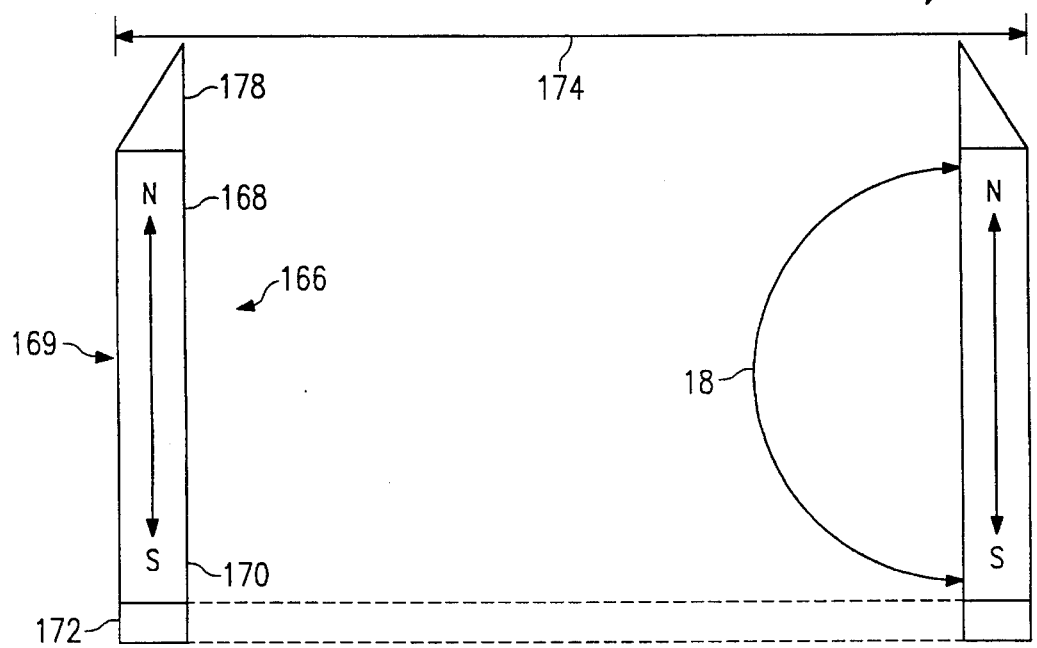

FIGS. 7 and 8, respectively, show side and top views of an alternative magnetron permanent magnet assembly 164 that may be used with the preferred embodiment of the present invention. Referring to FIG. 7, magnets such as magnet 166 are positioned with a vertical orientation so that the north (or south) pole 168 is at the top and south (or north) pole 170 is at the bottom of wall 169 and contacts base 172 of alternative magnetron permanent magnet assembly 164. Note that alternative magnetron assembly 164 has the same space limitations as magnetron assembly 72 of FIGS. 5 and 6, above. Thus, outer diameter 174 must be sufficiently small to fit within reactor casing wall 32 while inner diameter 176 must be sufficiently large to fit around process chamber collar 38. As opposed to having alternating north and south poles as in magnetron 72 of FIGS. 5 and 6, magnetron 164 has all magnets magnetized vertically with the same orientation. Also appearing at and above north poles 168 of magnets such as magnet 166 is a soft iron ring 178 that serves to limit the propagation of the magnetic field from the magnets 166.

A general distinction between magnetron assembly 72 of FIGS. 5 and 6 and magnetron assembly 164 of FIGS. 7 and 8 is the flux distribution that the respective orientations produce. For example, magnetron assembly 72 of FIGS. 5 and 6 form a multipolar magnetic field inside process chamber collar 38. Moreover, the arrows 182 of FIG. 7 show the top-to-bottom magnetic flux distribution that the vertically oriented magnets of magnetron assembly 164 produce. Although using magnetron permanent magnet assemblies 72 or 164 enhances screen electrode plasma density for the preferred embodiment, their use is optional for the essential purposes of the present invention.

Figure 9:
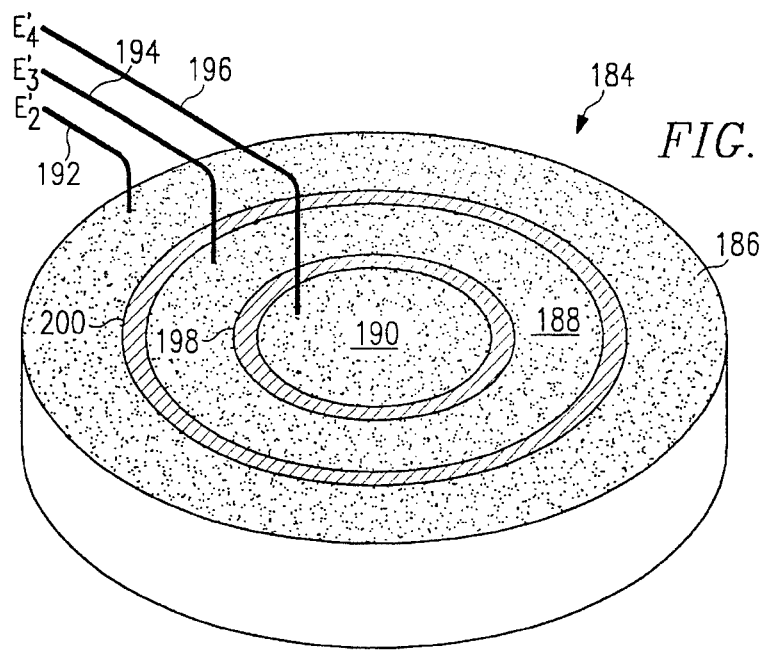
FIG. 9 shows a partitioned showerhead assembly for multi-electrode and/or multi-frequency plasma processing with the preferred embodiment of the present invention.

FIG. 9 shows an alternative configuration of showerhead assembly 52 that provides multiple showerhead electrode zones for multi-zone plasma processing. Referring to FIG. 9, alternative showerhead assembly 184 includes concentric plasma electrode rings such as outer concentric ring 186, middle concentric ring 188, and inner disk 190 that connect, respectively, to outer showerhead electrode line $E_2'$ 192, middle electrode line $E_3'$ 194 and inner electrode line $E^{4'}$ 196. Separating concentric showerhead portions 186, 188 and 190 is an insulating material 198 and 200 that may be made of macor, teflon, ceramic or some other electrically insulating material. Note that this configuration provides three showerhead electrode connections 186, 188, 190, plus the screen electrode 66 and chuck 24. This is a total of five plasma electrodes for multi-zone plasma processing. The relative radio-frequency power to the showerhead electrodes can be adjusted to optimize plasma process uniformity.

Figure 10:
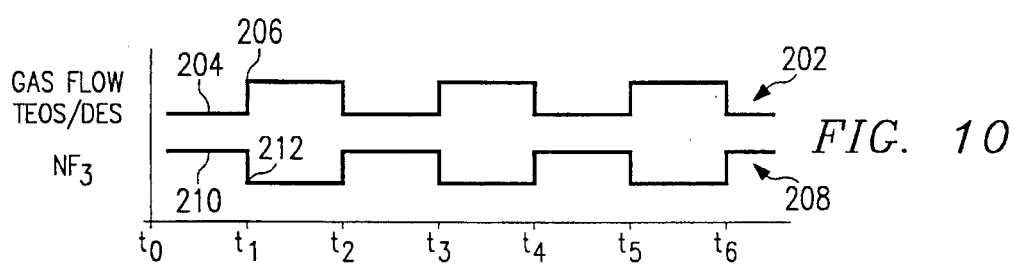
FIG. 10 illustrates plasma time-division multiplexing for intermittent oxide PECVD and in-situ cleaning processes that the preferred embodiment may employ.

FIG. 10 illustrates how a cleaning and PECVD process may be time-division multiplexed in real time using the preferred embodiment for silicon dioxide deposition. For example, line 202 may indicate flow of diethylsilane (DES) gas beginning at $t_o$ and zero level 204. At time $t_1$, flow increases to finite flow level 206. Also, at time to, line 208 represents the flow of $NF_3$ cleaning gas beginning at high level 210. At time $t_1$, $NF_3$, gas flow drops to low (zero) level at 212. For a predetermined time, the DES gas will flow until, at time $t_2$ DES gas flow drops, again, to low or zero level at 204, and $NF_3$ cleaning gas returns to its high level at 210. At this point, a chamber cleaning process occurs until, at time $t_3$, flow of cleaning gas $NF_3$ goes to low or zero level at 212, while DES returns to high level at 206. This type of gas flow chopping may occur while electrode line $E_3$ to RF chuck 24 connects to high-frequency RF tuner 122, electrode line $E_2$ 76 for showerhead 52 connects to low-frequency RF tuner 104, and electrode line $E_1$ for cylindrical screen electrode 66 connects to ground 110.

Figure 11:
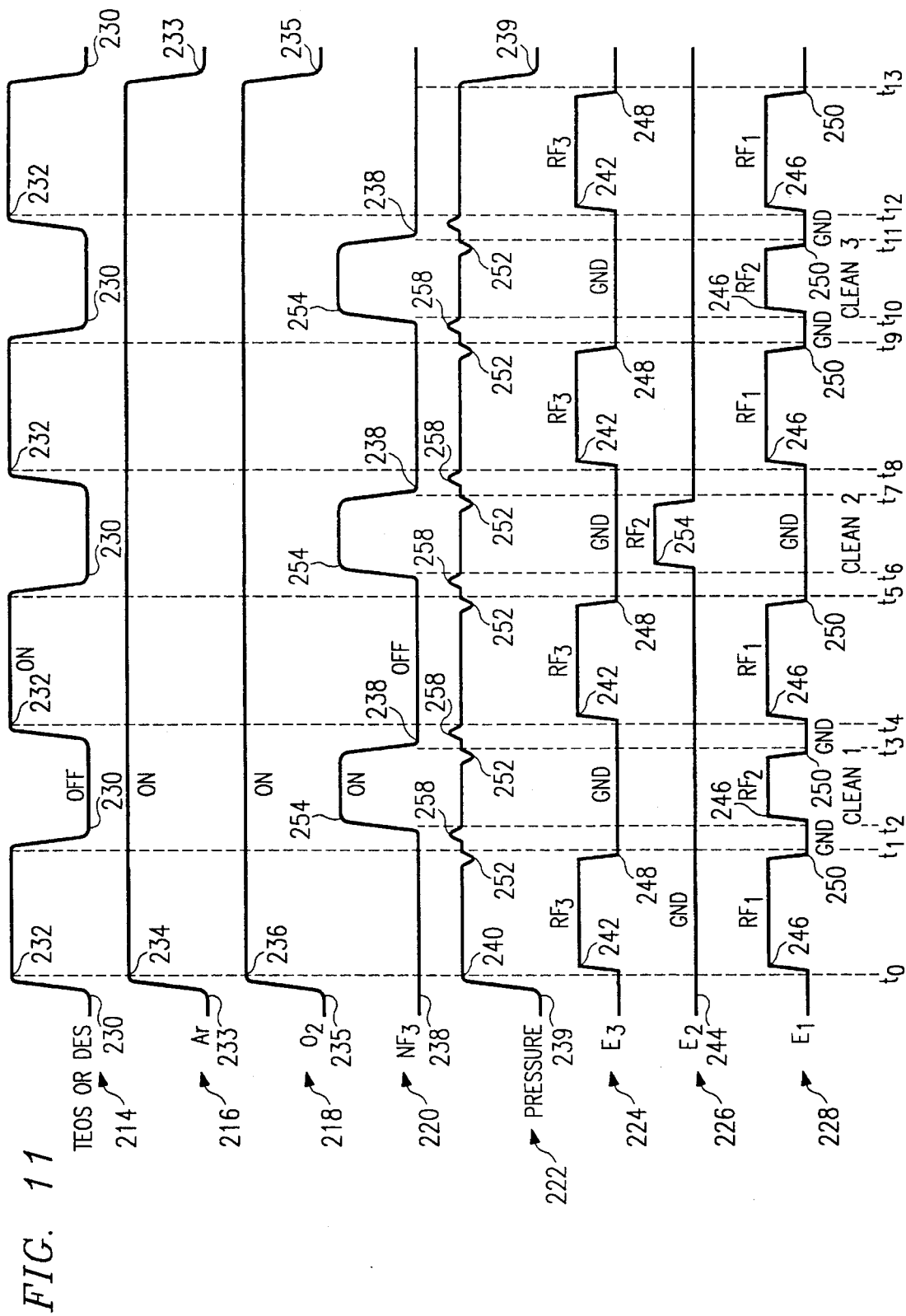
FIG. 11 shows a representative time-division multiplexing (TDM) operation for interspersed PECVD silicon dioxide deposition and in-situ plasma cleaning using the preferred embodiment.

The time lines of FIG. 11 employ the basic concepts of FIG. 10 to show an illustrative example of PECVD silicon dioxide deposition using a combination of TEOS or DES, oxygen, and argon with a cleaning gas combination of $NF_3$, oxygen, and argon in a time-division multiplexing or chopping mode. Referring to FIG. 11, line 214 represents the flow of DES or TEOS gas, line 216 represents the flow of argon gas, line 218 represents the flow of oxygen and line 220 represents the flow of $NF_3$ gas. Line 222 represents the total pressure within process chamber 10 occurring as a result of the process gas flow. At the same time that gas flows change, lines 224, 226 and 228 profile the radio-frequency signals to electrode line $E_3$, $E_2$, and $E_1$, respectively.

Beginning at time $t_o$, DES gas goes from zero level 230 to high level 232, argon gas goes from zero level 233 to high level 234, oxygen gas flow rises from zero level 235 to high level 236, and $NF_3$ gas level remains at constant zero level 238. As a result of gas flow beginning in process chamber 10, pressure line 222 indicates a process chamber pressure rise to level 240. Referring to the electrode lines $E_3$, $E_2$, and $E_1$, at time to electrode line $E_3$ to RF chuck 24 receives a 13.56 MHz signal indicated by level 242, electrode line $E_2$ to showerhead 52 connects to ground, and electrode line $E_1$ receives a 13.56 MHz signal from high-frequency RF tuner 96 as level 246 indicates. During this phase of this exemplary process, a deposition of silicon dioxide may occur on wafer surface 22 in the environment 62 of process chamber 10.

At $t_1$, process parameters change in the exemplary process. DES flow returns to off level 230, electrode line $E_3$ connects to ground causing the signal to drop to zero level 248, and electrode line $E_1$ connects to ground as the drop to zero level 250 shows. As a result of the change in gas flow, pressure line 222 may show a momentary slight pressure dip 252 followed by a rapid return to previous pressure level 240 (via closed-loop pressure controller).

At time $t_2$ cleaning within process chamber 10 begins by introducing $NF_3$ gas. $NF_3$ gas flow goes from low or zero level 238 to high level 254. Electrode line $E_1$ to cylindrical screen electrode 66 receives a 100 kHz signal from low-frequency RF tuner 104. The line 228 transition to level 246 represents this change. At this point, pressure within process chamber 10 may show a minor increase or bump such as the increase to level 258 followed by rapid return to the steady-state level 240.

At time $t_3$, in-situ cleaning ceases as $NF_3$ gas flow, 100 kHz signal to electrode $E_1$, and electrode $E_1$ power return to zero levels. At this point, pressure momentarily dips to level 252 and then returns to level 240.

At time $t_4$, a second cycle of silicon dioxide deposition occurs. For this process, DES gas line 214 shifts from zero level 230 to high level 232, electrode line $E_3$ connects to high-frequency RF tuner 122, and electrode $E_1$ connects to high-frequency RF tuner 96. All other process parameters remain the same. This change in gas flow causes momentary pressure bump 258.

At time $t_5$, this second deposition ceases when DES gas flow ends, and the 13.5 GHz signals terminate as electrode lines $E_3$ and $E_1$ connect to ground. Pressure again dips to low level 252 to return to steady-state level 240.

At time $t_6$, a second cleaning process cycle begins with $NF_3$ gas flow going from level 238 to level 254 and electrode line $E_2$ connecting to a 100 kHz signal from low-frequency RF tuner 104. This in-situ cleaning process ceases at time $t_7$ when $NF_3$ gas flow, returns to zero level 238 and electrode line $E_2$ voltage returns to ground 110. With $NF_3$ gas flow ceasing, pressure within process chamber 10 dips momentarily to level 252.

At time $t_8$, yet a third deposition process cycle is used. This third deposition process begins as DES gas goes to level 232, electrode line $E_3$ connects to high-frequency RF tuner 122 to receive 13.56 MHz signal, and electrode line $E_1$ connects to high-frequency RF tuner 96 to also receive a 13.56 MHz signal. The change in gas flow causes a temporary bump in process chamber pressure to level 258. This third deposition process will continue until it, at time $t_9$, DES gas flow returns to zero level 230, electrode line $E_3$ returns to ground level 248, and electrode line $E_1$ returns to ground level 250. This change also causes momentary pressure dip 252.

At time $t_{10}$, yet a third in-situ cleaning process within chamber 10 occurs as $NF_3$ gas flow goes to level 254, and electrode line $E_1$ connects to low-frequency RF tuner 104 to receive a 100 kHz signal. Momentary pressure bump 258 evidences this change in plasma gas flow. At time $t_{11}$, the cleaning process ceases as $NF_3$ gas returns to low level 238 and electrode line $E_1$ returns to ground potential 250. Pressure dip 252, at time $t_{11}$, is a result of this change in $NF_3$ gas flow.

A fourth and final deposition process cycle occurs when, at time $t_{12}$, DES gas flow goes to level 232, electrode $E_3$ receives a 13.56 MHz signal from high-frequency RF tuner 122 and electrode $E_1$ receives a 13.56 MHz signal from high-frequency RF tuner 96. This process cycle continues until, at time $t_{13}$, it ceases. Also, at time $t_{13}$ the PECVD silicon dioxide deposition and cleaning processes cease. DES gas flow returns to zero level 230, argon gas flow 216 drops to level 233, oxygen gas flow 218 drops to level 235, $NF_3$ gas flow remains at level 238, pressure drops to pre-process vacuum level 239, electrode $E_3$ (line 224) drops to ground potential 248, electrode $E_2$ remains at ground level 244, and electrode $E_1$ line potential drops to ground level 250. This completes the process of FIG. 11. The above-mentioned process shows an example of a time-division multiplexed PECVD process along with in-situ cleaning via multi-electrode plasma processing.

Figure 13:
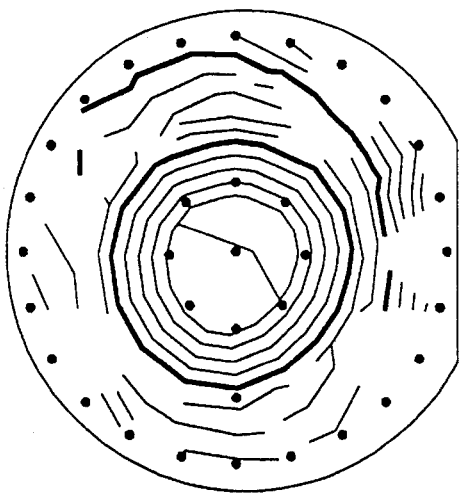
FIGS. 12 and 13 show thickness uniformity profiles for PECVD oxide deposition.
Figure 12:
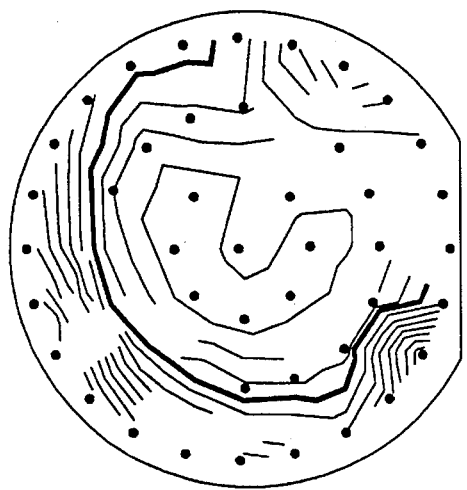

FIGS. 12 through 15 show results obtainable using the preferred embodiment of the present invention on 150 mm wafers. In particular, FIGS. 12 and 13 show examples of PECVD DES oxide deposition uniformity measurements for processes occurring using two different sets of process parameters. FIG. 12 shows the results of flowing 500 standard cubic centimeters per minute (SCCM) of argon, 100 SCCM of oxygen, and 25 SCCM of DES in a plasma process chamber at a pressure of 3 Torr. Cylindrical screen electrode 66 connects via electrode line $E_1$ to ground, showerhead electrode 76 receives via electrode line $E_2$ 10 watts of a 100 kHz signal from low-frequency RF tuner 104, and radio-frequency chuck 24 connects via electrode line $E_2$ to 50 watts of 13.56 MHz power such as that from high-frequency RF tuner 122. The following table shows statistical variations appearing in the wafer results that FIG. 12 illustrates.

TABLE I

| MEAN THICKNESS | 7574. Å | | WAFER DIA. | 150.00 mm /5.91 in |
|---|---|---|---|---|
| STD DEV | 220.08 Å | 2.905% | TEST | 140.00 mm |
| MINIMUM | 6990.2 Å | | DIA. | /5.91 in |
| MAXIMUM | 7984.0 Å | | CONTOUR DISPLAY | STANDARD |
| | | | INTERVAL | 58.000 |

Similarly, FIG. 13 shows measurements taken after a PECVD process with 100 SCCM argon, 100 SCCM oxygen, and 25 SCCM DES gas flows performed at a pressure of 1 Torr. In the process of FIG. 13, cylindrical screen electrode 66 is floating, RF chuck 24 receives 50 watts of a 13.56 MHz signal from RF tuner 122, and showerhead electrode 76 connects to ground. Table II shows the statistical results that process achieved.

TABLE II

| MEAN THICKNESS | 5847.2 Å | | WAFER DIA. | 150.00 mm /5.91 in |
|---|---|---|---|---|
| STD DEV | 198.69 Å | 3.398% | TEST | 140.00 mm |
| MINIMUM | 5.510.1 Å | | DIA. | /5.51 in |
| MAXIMUM | 6201.1 Å | | CONTOUR | STANDARD |
| NUMBER OF SITES/GOOD | 49/46 | | DISPLAY INTERVAL | 68.000 |

Table III shows exemplary results for deposition rate in angstroms per minute using the multi-zone, multi-electrode plasma processes of the preferred embodiment at two different pressures. As shown, the higher pressure PECVD process results in a higher deposition rate.

TABLE III

| PRESSURE (Torr) | 1 | 3 |
|---|---|---|
| RATE (ang/min) | 1300 | 1700 |
| Ar (sccm) | 100 | 500 |
| TEOS (sccm) | 25 | 100 |
| O2 (SCCM) | 100 | 100 |
| RF@ chuck | 50 W,13.56 MH$_z$ | 50 W,13.56 MHz |
| RF@ showerhead | grounded | grounded |
| RF@ perforated screen | 20 W,100 kH$_z$ | 20/W, 100 kH$_z$ |

Figure 15:
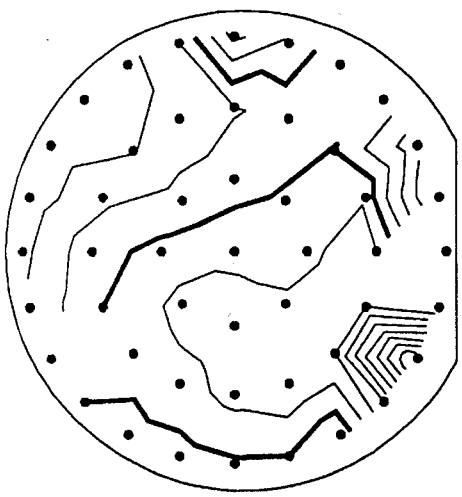
FIGS. 14 and 15 show uniformity profiles for PECVD oxide deposition using the preferred embodiment and a two-zone plasma.
Figure 14:
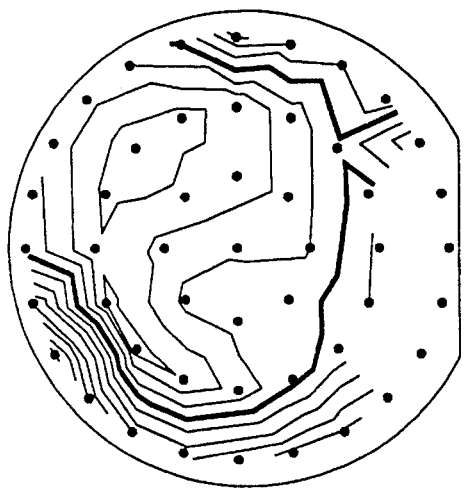

FIGS. 14 and 15 further show the PECVD oxide thickness uniformity control achievable using the multi-zone plasma processing apparatus of the preferred embodiment. The process of FIG. 14 uses 500 SCCM of argon, 100 SCCM of oxygen, and 25 SCCM of DES with a 3-Torr process pressure. Cylindrical screen electrode 66 connects to ground, showerhead assembly 52 connects to ground, and RF chuck 24 receives 50 watts of 13.56 MHz source. Table IV shows the statistical results of this process.

TABLE IV

| MEAN | 11321.0 Å | | WAFER | 150.00 mm |
|---|---|---|---|---|
| STD DEV | 463.70 Å | 4.096% | DIA. | /5.91 in |
| MINIMUM | 9535.5 Å | | TEST | 140.00 mm |
| MAXIMUM | 11933 Å | | DIA. | /5.51 in |
| | | | CONTOUR DISPLAY INTERVAL | STANDARD 160.00 |

Finally, FIG. 15 shows the results of a process that uses 500 SCCM of argon, 100 SCCM of oxygen, and 25 SCCM of DES at a 3 Torr process pressure. Electrode line $E_1$ 74 connects to a 15 watt 100 kHz low-frequency source such as RF tuner 104, electrode line $E_2$ 76 connects to ground, and electrode line $E_3$ 26 receives 50 watts of 13.56 MHz source such as that from RF tuner 122. Table V shows the statistical results of this process. As shown, this PECVD process with multizone plasma generation provides improved oxide thickness uniformity compared to the single-zone plasma deposition process of Table IV. The multi-electrode plasma configuration allows adjustments of relative zone plasma densities in order to optimize the overall process uniformity. Note that all the PECVD processes were performed at approximately 400° C.

TABLE V

| MEAN | 12075 Å | | WAFER | 150.00 mm |
|---|---|---|---|---|
| STD DEV | 346.25 Å | 2.868% | DIA. | /5.91 in |
| MINIMUM | 10582 Å | | TEST | 140.00 mm |
| MAXIMUM | 12734 Å | | DIA. | /5.51 in |
| | | | CONTOUR DISPLAY INTERVAL | STANDARD 160.00 |

Figure 16:
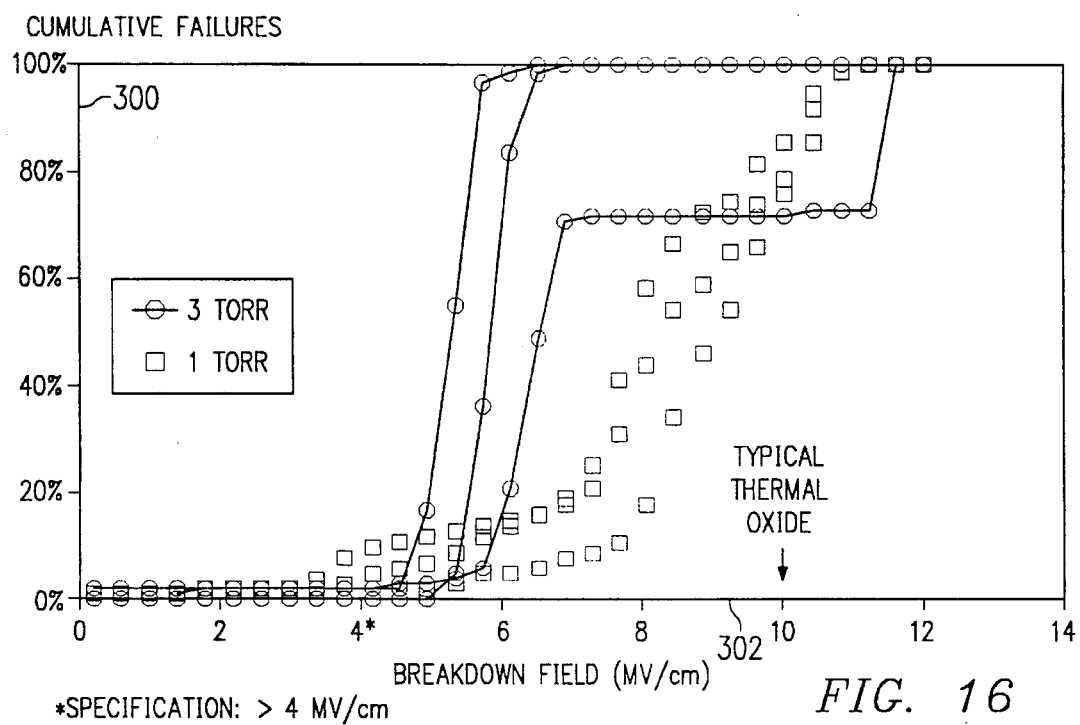
FIG. 16 shows test results associated with aluminum-gate MOS capacitors with oxide dielectrics made with the method and apparatus of the preferred embodiment.

FIG. 16 shows the device electrical results that the multi-electrode, multi-zone plasma processing method and apparatus of the preferred embodiment provide. In particular, FIG. 16 shows electrical breakdown measurements on aluminum-gate metal-oxide semiconductor (MOS) capacitors with PECVD oxide gate dielectrics using the preferred embodiment. Referring to FIG. 16, along the vertical axis 300 appear percentage dielectric failures ranging from 0% to 100%. Along horizontal axis 302 appear measurements of electrical breakdown fields for the capacitors in measures of megavolts per centimeter ranging from 0 MV/cm to 14 MV/cm. The process requirement specification for the capacitors in this example is that mean breakdown must occur above 4 MV/cm. As FIG. 16 illustrates, those capacitors formed at a process pressure of 1 Torr have a breakdown field generally ranging between 6 and 10 MV/cm. The breakdown field for capacitors formed in a 3 Torr process is between 4 and 7 MV/cm, approximately. Generally, all breakdowns occur above the 4 MV/cm requirement. These results indicate the acceptable electrical quality of these PECVD oxide layers from the method and apparatus of the preferred embodiment.

Although the invention has been described with reference to the above-specified embodiments, this description is not meant to be construed in a limiting sense. Various modifications of the disclosed embodiment, as well as alternative embodiments of the invention will become apparent to persons skilled in the art upon reference to the above description. It is therefore, contemplated that the appended claims will cover such modification that fall within the true scope of the invention.

What is claimed is:

1. A method for plasma-enhanced processing using multi-electrode plasma generation in a process chamber, comprising the steps of:

holding a semiconductor wafer against a chuck electrode;

injecting a plasma-producing gas through a showerhead electrode to the surface of a semiconductor wafer; and producing a plasma from said plasma-producing gas wherein said plasma interacts with the walls of the process chamber through a peripheral chamber wall electrode having a conducting screen.

2. The method of claim 1, further comprising the step of:

selectably connecting one of a plurality of voltage sources to said chuck electrode;

selectably connecting one of said plurality of voltage sources to said showerhead electrode; and selectably connecting one of said plurality of voltage sources to said peripheral chamber wall electrode.

3. The method of claim 2, wherein said plurality of voltage sources comprises a high frequency rf source, a low frequency rf source and ground.

4. The method of claim 3, wherein said plurality of voltage sources further comprises a floating source.

5. The method of claim 1 wherein said showerhead electrode comprises a first electrode ring, a second electrode ring concentric about said first electrode ring and a third electrode ring concentric about said second electrode ring.

6. The method of claim 5, further comprising the steps of:

connecting a first electrical signal to said first electrode ring of said showerhead electrode;

connecting a second electrical signal to said second electrode ting of said showerhead electrode; and connecting a third electrical signal to said third electrode ring of said showerhead electrode.

7. The method of claim 1, further comprising the step of producing a magnetic field in said process chamber.

8. The method of claim 1, further comprising the step of time-division multiplexing said step of injecting said plasma-producing gas with a step of injecting a cleaning gas to create a plasma for cleaning said walls of said chamber.

9. The method of claim 1, wherein said plasma producing gas is a chamber cleaning gas chemistry.

10. The method of claim 1, further comprising the steps of:

connecting a high frequency rf voltage source to said chuck electrode;

connecting a ground voltage to said peripheral chamber wall electrode; and connecting said showerhead electrode to a low frequency rf voltage source to create an electric field in said process chamber, wherein the step of flowing a plasma-producing gas comprises the steps of:

flowing a plasma producing gas through said electric field for a first time period to create a first plasma;

flowing a cleaning gas through said electric field for a second time period after said first time period to create a second plasma for cleaning said walls of said process chamber; and repeating both said flowing steps a number of times.

11. The method of claim 1, further comprising the steps of:

connecting said chuck electrode to a high frequency rf voltage source, said showerhead electrode to a ground voltage, and said peripheral chamber wall electrode to said high frequency rf voltage source to create a first electric field prior to said step of injecting said plasma producing gas;

switching said chuck electrode to said ground voltage and said peripheral chamber wall electrode to a low frequency voltage source to create a second electric field after said step of producing a plasma;

injecting a cleaning gas through said showerhead electrode to said second electric field to create a plasma for cleaning said walls of said process chamber;

switching said chuck electrode to said high frequency rf source and said peripheral chamber wall electrode to said high frequency rf source to recreate said first electric field after said step of injecting said cleaning gas;

injecting said plasma-producing gas through said showerhead electrode into said first electric field to create a plasma;

switching said chuck electrode to said ground voltage, said showerhead electrode to a low frequency voltage source, and said peripheral chamber wall electrode to said ground voltage to create a third electric field;

injecting said cleaning gas through said showerhead electrode to said second electric field to create a plasma for cleaning said walls of said process chamber; and repeating the above steps a number of times.

* * * * *